US006821128B2

(12) United States Patent
Belopolsky et al.

(10) Patent No.: US 6,821,128 B2
(45) Date of Patent: Nov. 23, 2004

(54) LOW INDUCTANCE POWER CONNECTOR AND METHOD OF REDUCING INDUCTANCE IN AN ELECTRICAL CONNECTOR

(75) Inventors: Yakov Belopolsky, Harrisburg, PA (US); John R. Ellis, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/205,055

(22) Filed: Jul. 25, 2002

(65) Prior Publication Data

US 2002/0187661 A1 Dec. 12, 2002

Related U.S. Application Data

(63) Continuation of application No. 09/409,530, filed on Sep. 30, 1999, now Pat. No. 6,468,090.
(60) Provisional application No. 60/154,159, filed on Sep. 15, 1999.

(51) Int. Cl.[7] .............................................. H01R 12/00
(52) U.S. Cl. .................... 439/65; 439/76.1; 439/495; 439/638; 439/654; 439/941; 439/83; 439/630
(58) Field of Search .......................... 439/62–65, 76.1, 439/630–631, 638, 654, 83, 941, 495, 59

(56) References Cited

U.S. PATENT DOCUMENTS

| 3,740,698 | A |   | 6/1973  | Jerominek .................. 339/176 |
| 3,963,300 | A | * | 6/1976  | Patton et al. ............... 439/638 |
| 4,236,779 | A |   | 12/1980 | Tang .......................... 339/143 |
| 4,400,049 | A |   | 8/1983  | Schuck ....................... 337/176 |
| RE32,626  | E |   | 3/1988  | Ito et al. ..................... 439/79 |
| 4,737,115 | A | * | 4/1988  | Seidler ....................... 439/83 |
| 5,873,739 | A |   | 2/1999  | Roberts ...................... 439/67 |
| 5,915,989 | A | * | 6/1999  | Adriaenssens et al. ...... 439/404 |
| 6,113,418 | A | * | 9/2000  | Kjeldahl ..................... 439/405 |
| 6,468,090 | B2| * | 10/2002 | Belopolsky et al. .......... 439/65 |

FOREIGN PATENT DOCUMENTS

| EP | 0 880 202 A2 | 11/1998 |
| GB | 2314467 A    | 12/1997 |

* cited by examiner

*Primary Examiner*—Truc T. T. Nguyen
(74) *Attorney, Agent, or Firm*—Woodcock Washburn LLP

(57) ABSTRACT

A low inductance power connector for reducing inductance in an electrical conductor is provided. An interface connector connects circuit boards together while reducing inductance and increasing current carrying capacitance. The connector for connecting circuit boards comprises a first contact having a first mating portion and a second mating portion, and a second contact having a first mating portion and a second mating portion, wherein the first and second contacts are interleaved.

9 Claims, 9 Drawing Sheets

LOW INDUCTANCE POWER CONNECTOR AND METHOD OF REDUCING INDUCTANCE IN AN ELECTRICAL CONNECTOR

RELATED APPLICATION DATA

This application is a continuation of patent application Ser. No. 09/409,530, filed Sep. 30, 1999, now U.S. Pat. No. 6,468,090 the entirety of which is incorporated herein by reference which claimed the benefit of Provisional Application No. 60/154,159 filed Sep. 15, 1999.

FIELD OF THE INVENTION

This invention generally relates to electrical connectors, and particularly, to a method and structure for reducing the inductance in electrical connectors while increasing the current carrying capacity.

BACKGROUND OF THE INVENTION

In today's high speed electronic equipment, it is desirable that the components of an interconnection path be optimized for signal transmission characteristics; otherwise, the integrity of the system will be impaired or degraded. Such characteristics include low inductance, increased current carrying capacity, suitable roll-off, and reduced ground bounce. Continuous efforts are made to develop electrical connectors that have as little effect on the system as possible.

Inductance is a concern in designing a connector. This is particularly true in electrical connectors for high speed electronic equipment. An example of one such connector is an edge card connector. An edge connector is provided for receiving a printed circuit board having a mating edge and contact pads adjacent the edge. Such edge connectors have an elongated housing defining an elongated receptacle or slot for receiving the mating edge of the printed circuit board. Terminals are spaced along one or both sides of the slot for engaging the contact pads adjacent the mating edge of the boards. In many applications, such edge connectors are mounted on a second printed circuit board. The mating edge board commonly is called the daughter board, and the board to which the connector is mounted is called the mother board. An inductive effect results from the interconnection of the printed circuit boards. Accordingly, it is desirable to reduce the inductive effects due to the interconnection of the printed circuit boards, and thus, there is a need for an interconnection system that reduces inductive effects between the boards being connected. Moreover, it is desirable to increase the current carrying capacity between the boards.

SUMMARY OF THE INVENTION

The present invention is directed to a low inductance power connector for reducing inductance in an electrical conductor. An interface connector connects circuit boards together while reducing inductance and increasing current carrying capacitance.

A connector according to one embodiment of the invention comprises a first contact having a first mating portion and a second mating portion, and a second contact having a first mating portion and a second mating portion, wherein the first and second contacts are interleaved.

According to aspects of the invention, the first mating portion of the first contact and the first mating portion of the second contact are disposed on opposite sides of a plane so that the first mating portions engage opposite sides of a circuit board. The first mating portions face each other and/or are offset from each other.

According to further aspects of the invention, the second mating portion of the first contact and the second mating portion of the second contact are disposed on opposite sides of a plane so that the second mating portions engage opposite sides of a circuit board, or the second mating portion of the first contact and the second mating portion of the second contact are coplanar so that the second mating portions engage the same side of a circuit board.

According to another aspect of the invention, the first and second mating portions of the first contact and/or the second contact are parallel to each other.

According to other aspects of the invention, each contact further comprises a body between the first and second mating portions, and the first and second mating portions are disposed at an angle with respect to the body. Preferably, the angle is approximately 90 degrees.

A connector according to another embodiment of the invention comprises a first substantially U shaped contact having a first mating portion and a second mating portion, and a second substantially U shaped contact having a first mating portion and a second mating portion.

According to one aspect of the invention, the first contact is disposed within the second contact so that the U shapes are in the same direction.

According to another aspect of the invention, the first contact is disposed within the second contact so that the U shapes are in opposing directions.

According to further aspects of the invention, the first and/or second mating portions are disposed side by side or overlapping each other.

The foregoing and other aspects of the present invention will become apparent from the following detailed description of the invention when considered in conjunction with the accompanying drawings.

DESCRIPTION OF EXEMPLARY EMBODIMENTS AND BEST MODE

Figure 1:
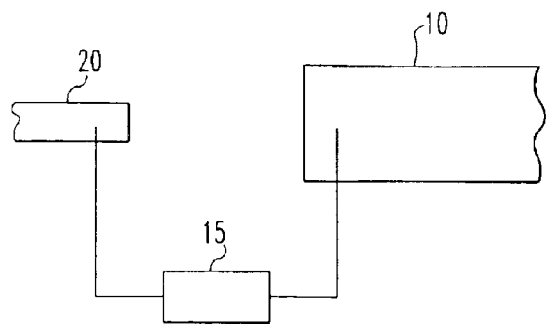
FIG. 1 shows a block diagram of a conventional interface connection between two circuit boards.

The present invention is directed to an interface connector 15 for connecting multiple circuit boards together. A typical circuit substrate such as a microprocessor board 10, shown in FIG. 1, can include traces or pads for, for example, cache, power, and return traces. It is desirable to connect the circuit board 10 to another circuit substrate such as a power board 20. Typically, the cache, the power, and the return traces connect to suitable conductive elements on board 20. It is desirable to reduce the inductance between the interconnection of the boards, while at the same time, increase the current carrying capacity. It is understood that the arrangement of cache, power, and return traces could be varied as desired by the circuit board designer.

Figure 2:
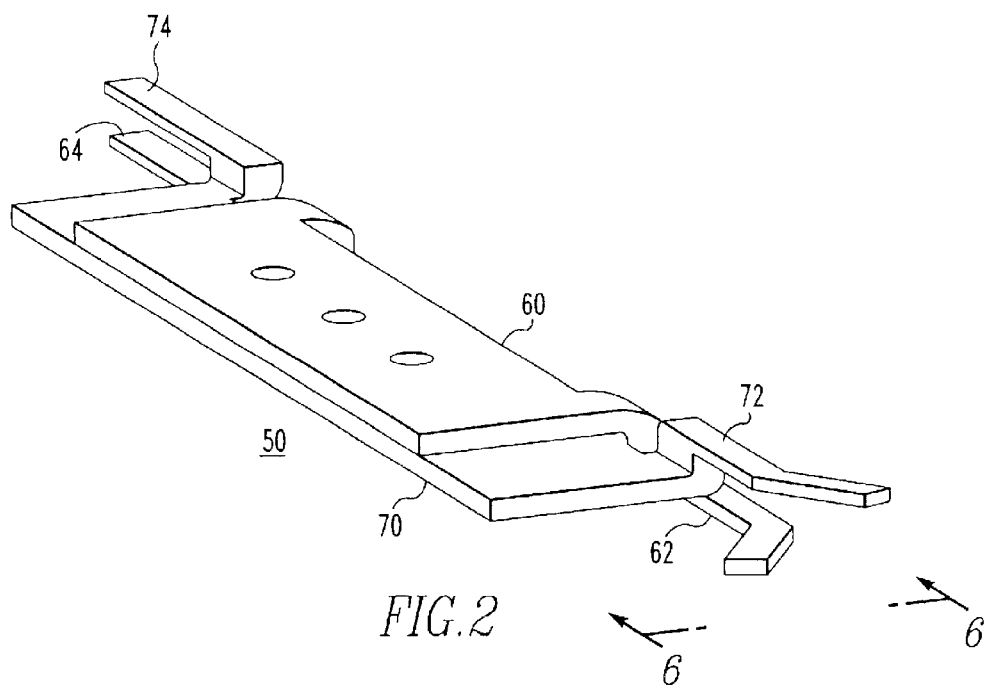
FIG. 2 is a perspective view of an exemplary connector having horizontal contacts in accordance with the present invention.
Figure 3A:
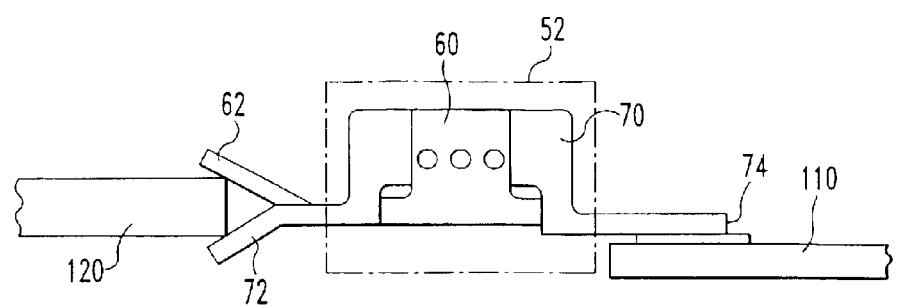
FIGS. 3A and 3B show a side view and a top view, respectively, of the connector of FIG. 2.

FIG. 2 shows a perspective view of a pair of exemplary contacts used in a connector in accordance with the present invention. The contact pair 50 comprises a first contact or plate 60 and a second contact or plate 70 that are interleaved. Preferably, the contacts 60 and 70 are separated by a dielectric material, such as Kapton, to prevent shorting and other interference. At each end of the first contact 60 is a mating portion 62, 64, and at each end of the second contact 70 is a mating portion 72, 74 to engage boards 110, 120 (shown, for example, in FIGS. 3A and 3B). The medial portion of contacts 60, 70 extends generally transverse, preferably perpendicular, to boards 110, 120. Preferably, one end of contacts 60, 70 is fixed to one board 110, 120 using, for example, solder. The other end of contacts 60, 70 preferably removably receive the other board 110, 120. The mating portions 62 and 72 can both engage a board on the same side of the board, or on opposite sides of the board. Similarly, the mating portions 64 and 74 can both engage a board on the same side of the board, or on opposite sides of the board. Preferably, the body of the connector, comprising contacts 60 and 70, is overmolded in a plastic housing 52, as shown in FIG. 3A, although other methods of assembling the connector are possible. For example, suitable fasteners (not shown) can extend through openings 61, 71 in 60, 70 to retain a series of contacts together (preferably separated by suitable dielectric material).

Figure 3B:
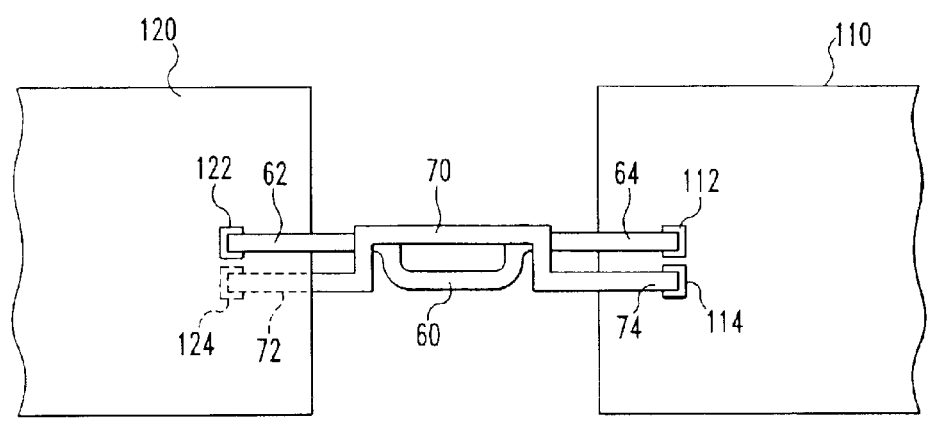

A side view of the connector pair 50 is shown in FIG. 3A, and a top view is shown in FIG. 3B. A circuit board 110 having various conductive elements such as traces or pads 112 and 114 is inserted between the mating portions 64 and 74 on one end of the connector 50, and a second circuit board 120 having conductive elements such as traces or pads 122 and 124 is inserted between the mating portions 62 and 72 on the other end of the connector 50. In this manner, the traces 112 and 122 of the circuit boards 110 and 120 are electrically connected, and the traces 114 and 124 of the circuit boards 110 and 120 are electrically connected. In the embodiment of FIG. 3, the mating portions 62 and 72 engage the traces or pads 122, 124 on opposite sides of the board 120, and the mating portions 64 and 74 engage the traces or pads 112, 114 on the same side of the board 110. To interconnect additional pairs of traces, additional contacts (not shown) can be used.

Figure 4:
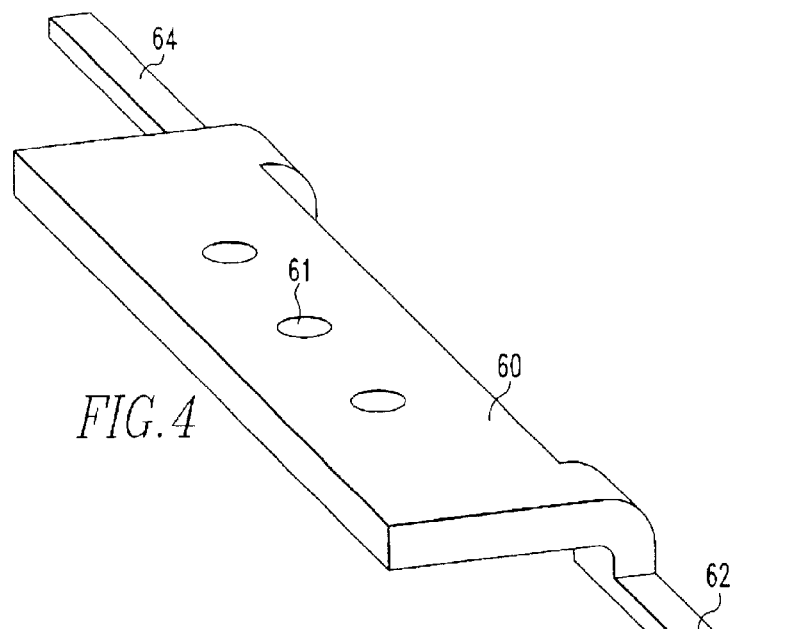
FIG. 4 is a perspective view of a first contact of the connector of FIG. 2.
Figure 5:
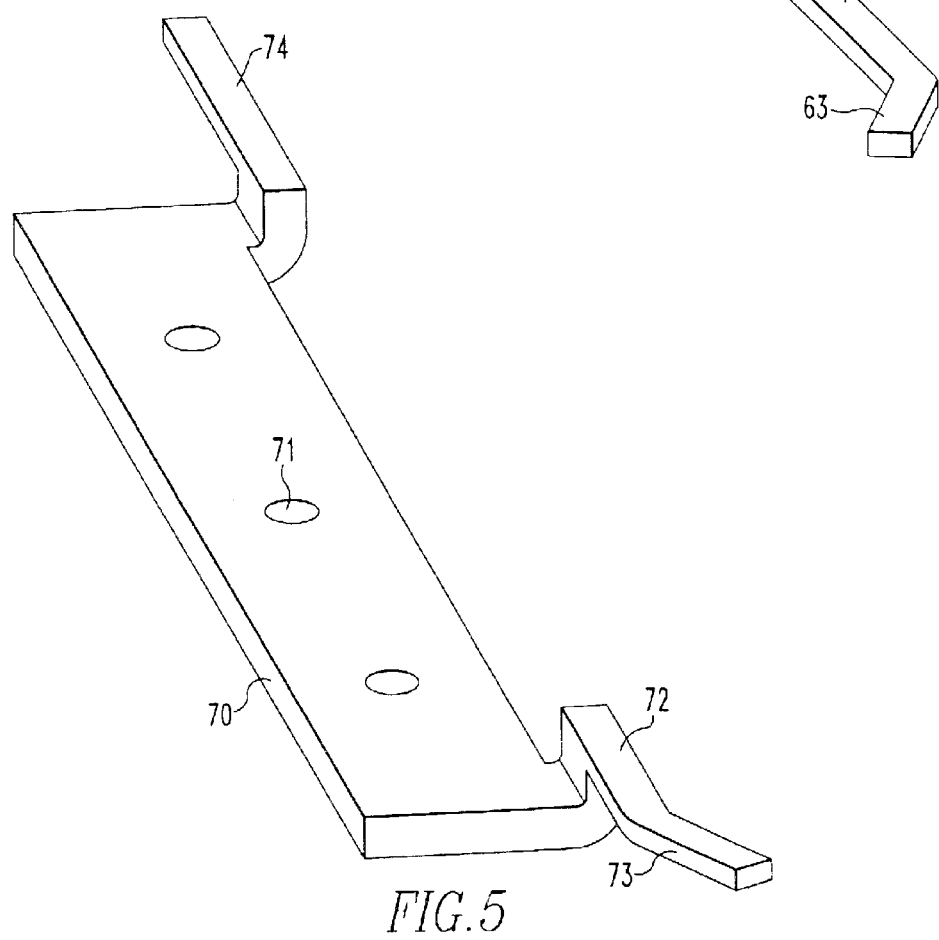
FIG. 5 is a perspective view of a second contact of the connector of FIG. 2.
Figure 6:
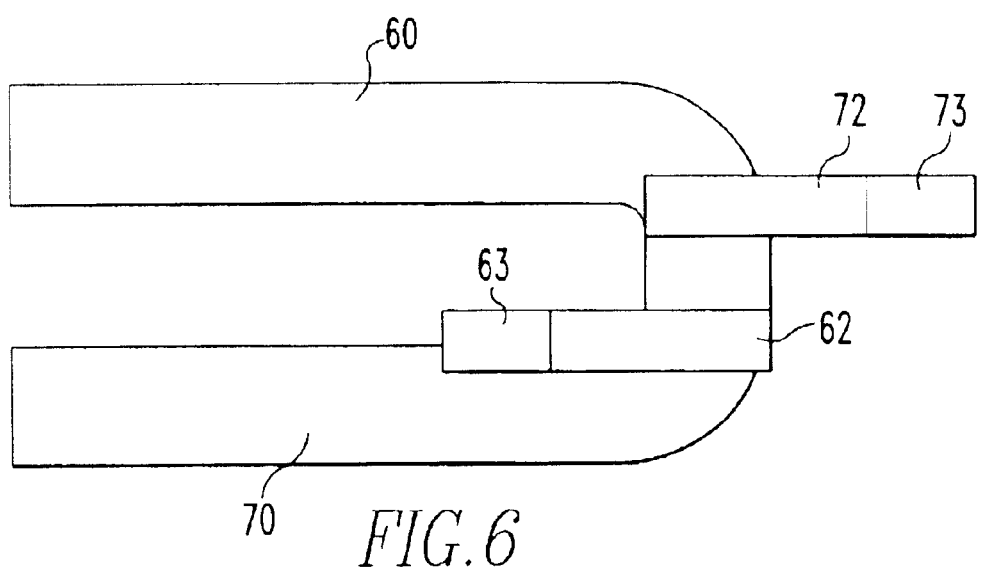
FIG. 6 is a side view of the connector of FIG. 2.

FIG. 4 shows a perspective view of the first contact 60 and FIG. 5 shows a perspective view of the second contact 70. As shown in FIG. 4, one alternative provides the first contact 60 having a straight mating portion 64 parallel to the contact 60 at one end, and an angled contact tip 63 extending from the straight mating portion 62 that is disposed parallel to the contact 60 at the other end. FIG. 5 shows similar features of an alternative of the second contact 70, notably an angled contact tip 73. It is contemplated that the mating portions 62, 64, 72, 74 can be either straight, angled, or have any other suitable arrangement, depending on the circuit boards the connector 50 is to interconnect. A side view of the connector 50 of FIG. 2 along the line 6—6 is shown in FIG. 6. As shown, the contact tip 63 is angled in a direction opposite to the angle of the contact tip 73. However, the contact tip 63 can be any angle relative to the angle of the contact tip 73. Preferably, the mating portions 62 and 72 are parallel to each other, as are the mating portions 64 and 74.

Figure 7B:
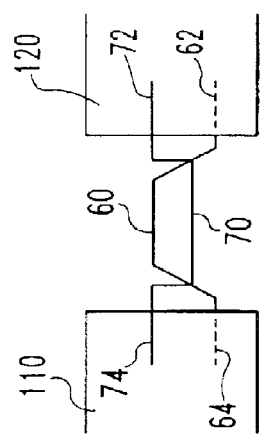
FIGS. 7A and 7B show side and top views, respectively, of an alternative exemplary connector in accordance with the present invention.
Figure 7A:
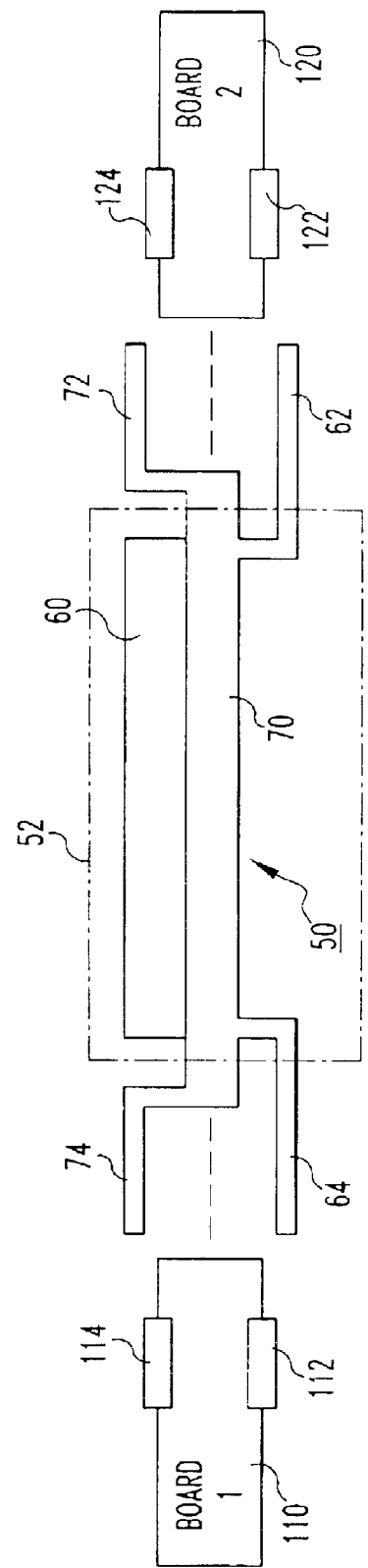

FIGS. 7A and 7B show side and top views, respectively, of an alternative connector in accordance with the present invention. The connector 50 comprises interleaved contacts 60 and 70, similar to those described above with respect to FIG. 2. The connector 50 is adapted to engage traces on both sides of the boards 110, 120. In particular, the mating portions 62 and 72 are disposed such that they engage the traces 122, 124 on opposite sides of the board 120. Similarly, the mating portions 64 and 74 are disposed such that they engage the traces 112, 114 on opposite sides of the board 110. Mating portions 62, 64, 72, 74 could have any suitable termination to make an effective electrical connection between traces 112, 114, 122, 124 and contacts 60, 70. To interconnect additional pairs of traces, additional contacts (not shown) can be used.

Figure 8A:
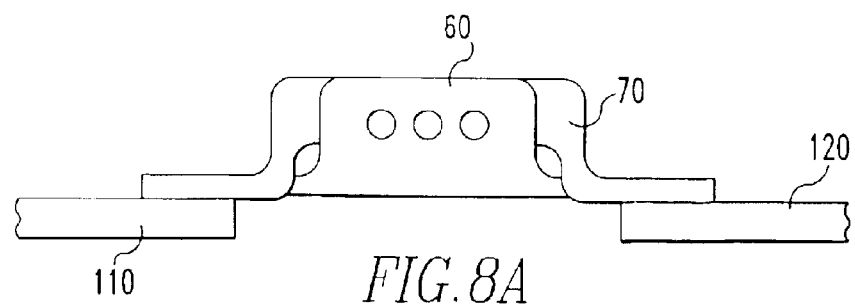
FIGS. 8A and 8B show side and top views, respectively, of a further alternative exemplary connector in accordance with the present invention.
Figure 8B:
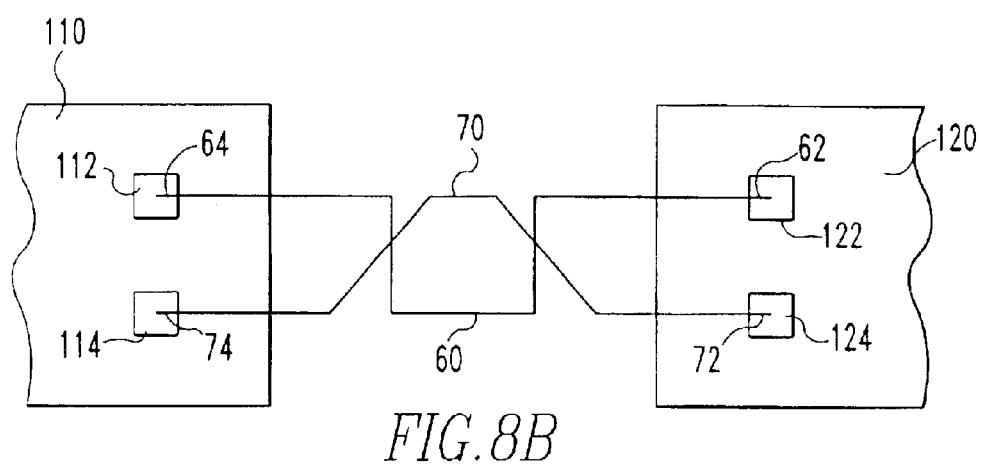

FIGS. 8A and 8B show side and top views, respectively, of a further alternative connector in accordance with the present invention. The connector 50 comprises interleaved contacts 60 and 70 and is adapted to engage traces on one side of the boards 110, 120. In particular, the mating portions 62 and 72 are disposed such that they engage the traces 122, 124 on the same side of the board 120. Similarly, the mating portions 64 and 74 are disposed such that they engage the traces 112, 114 on the same of the board 110. Any suitable termination could be used to make effective electrical connection between traces 112, 114, 122, 124 and contacts 60, 70. To interconnect additional pairs of traces, additional contacts (not shown) can be used.

Figure 9:
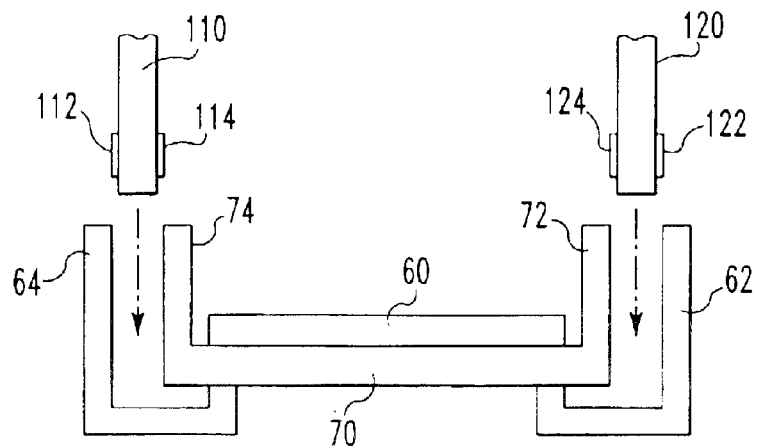
FIG. 9 is a side view of an exemplary connector having vertical contacts in accordance with the present invention.

Although the embodiments of FIGS. 2–8 have contacts or mating portions that are parallel with the contact plates, it is contemplated that the contacts or mating portions can be any other angle with respect to the contact plate. For example, the mating portions 62, 64, 72, 74 can be disposed in a direction perpendicular to the contacts 60, 70, as shown in FIG. 9. In this manner, the boards 110, 120 can be stacked vertically.

Figure 10:
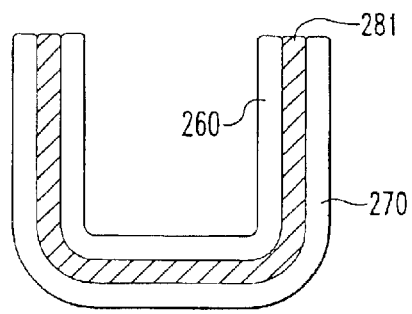
FIG. 10 is a cross-sectional view of another exemplary connector in accordance with the present invention.
Figure 11:
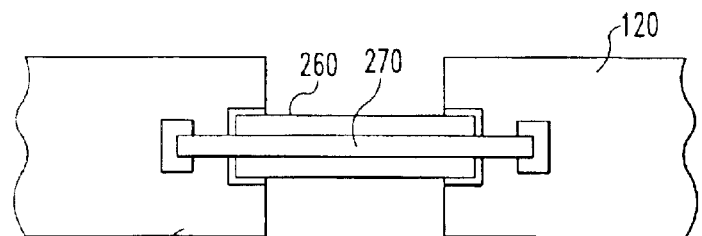
FIG. 11 is a top view of the connector of FIG. 10.
Figure 12:
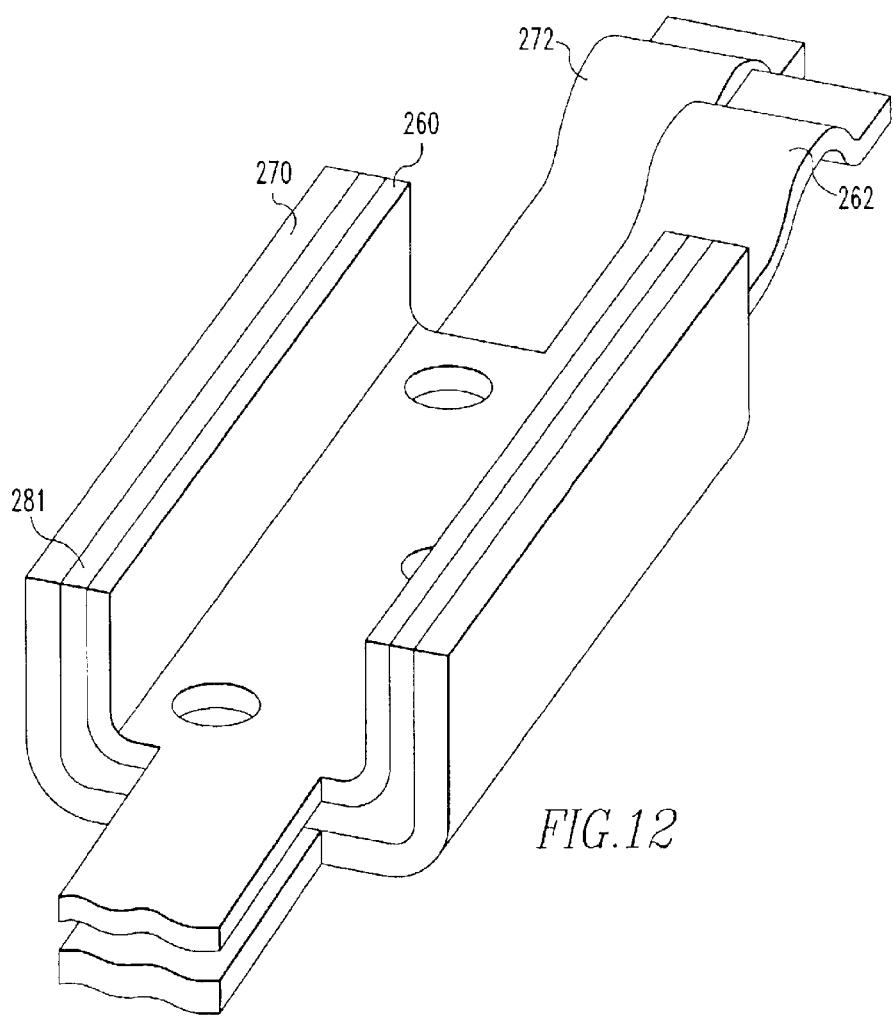
FIG. 12 is a perspective view of the connector of FIG. 10 having side by side contacts.
Figure 13:
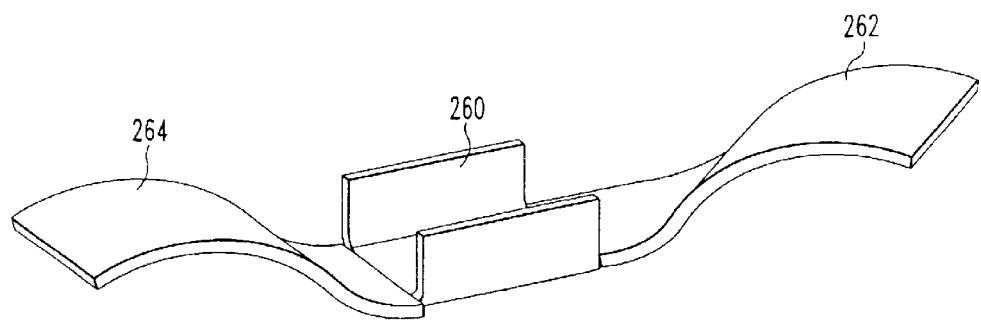
FIG. 13 is a perspective view of a plate of FIG. 10 having contacts disposed at both ends.
Figure 14:
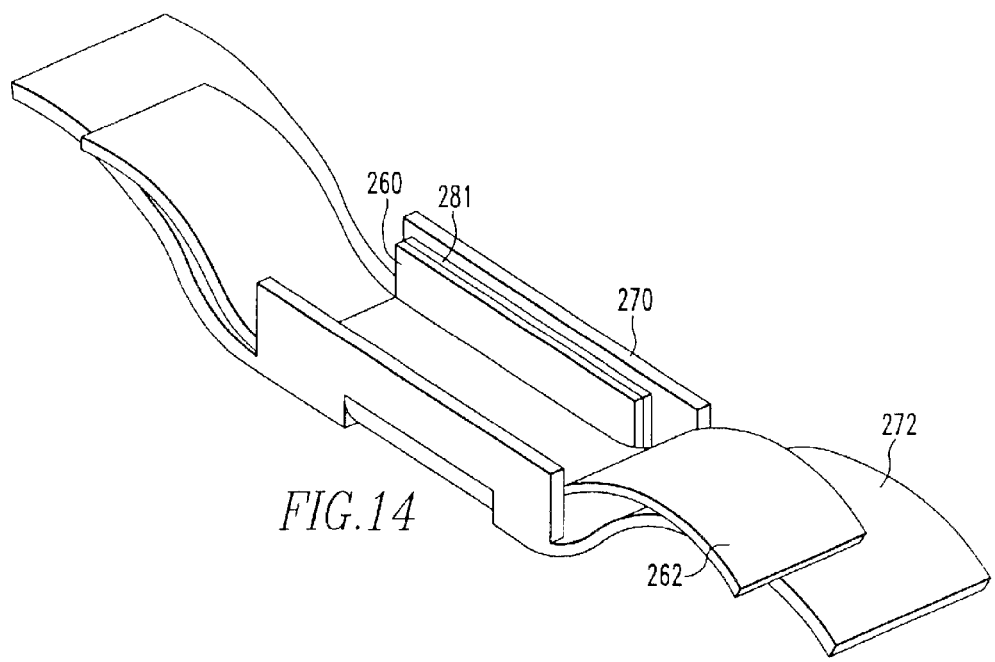
FIG. 14 is a perspective view of overlapping contacts in conjunction with the connector of FIG. 10.

Unlike the above embodiments, in which the contact plates are interleaved, the plates can also have other arrangements, such as separate U shapes, separated by a dielectric material. A cross-sectional view of an exemplary embodiment in accordance with the present invention is shown in FIG. 10, and a top view is shown in FIG. 11. In this embodiment, one U shaped plate 260 is disposed within another U shaped plate 270 but separated by a dielectric material 281. Contacts or mating portions extend from the ends of the plates, as shown, for example, in FIGS. 12 and 13, to contact associated traces or pads on boards 110, 120. Although FIG. 12 only shows mating portions 262, 272 extending from one end of the plates, it is contemplated that additional contacts or mating portions extend from the other end of the plates. An exemplary U shaped plate having mating portions 262,264 extending from each end is shown in FIG. 13. The contacts and mating portions can be either side by side, as shown in FIG. 12, or superposed as shown in FIGS. 11 and 14.

Figure 15:
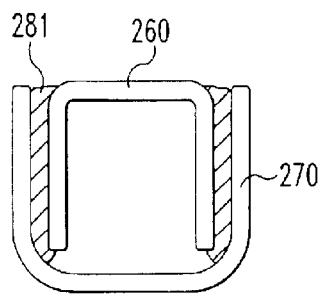
FIG. 15 is a cross-sectional view of another exemplary connector in accordance with the present invention.

Another exemplary embodiment is shown in FIG. 15 in which a U shaped plate 260 is disposed upside down in another U shaped plate 270. As with the other embodiment, a dielectric material 281 separates the plates 260, 270. Similar to the above embodiment, the contacts are at the ends of the plates 260, 270 and can either be overlapping or side by side.

Figure 16:
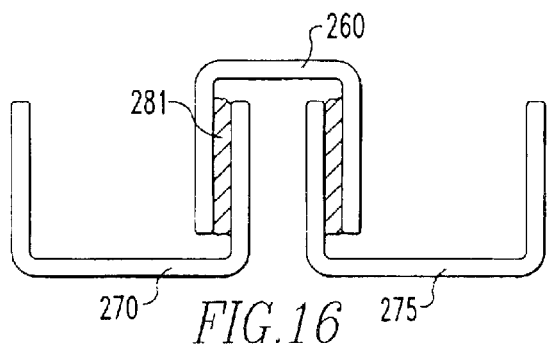
FIG. 16 is a cross-sectional view of another exemplary connector in accordance with the present invention.

Another exemplary embodiment is shown in FIG. 16 in which a U shaped plate 260 is disposed upside down with respect to another U shaped plate 270, as in FIG. 15, and in this embodiment the upside down plate 260 is offset so that one leg of the U is disposed in one U shaped plate 270, and the other leg is disposed in a neighboring U shaped plate 275. It should be noted that a plurality of the connectors of the present invention can be disposed in parallel so that multiple contacts on circuit boards can be interconnected. As with the other embodiments, a dielectric material 281 can separate contacts 260, 270.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A connector comprising:
   a first contact having a first mating portion, a second mating portion, and a medial portion; and
   a second contact having a first mating portion, a second mating portion, and a medial portion, wherein the first and second contacts are disposed in an interleaved relationship to reduce the mutual inductance in the first and second contacts, and each first and second mating portion of the first and second contacts are disposed to connect a first circuit board to a second circuit board.

2. The connector of claim 1, wherein the first contact and the second contact are disposed such that current flows in different directions in the first and second contacts, and in parallel in the first and second contacts, to reduce the mutual inductance in the first and second contacts.

3. The connector of claim 1, wherein the first and second contacts are sized to increase capacitance, thereby reducing the mutual inductance in the first and second contacts.

4. The connector of claim 1, wherein each medial portion is larger than its associated first and second mating portions.

5. The connector of claim 1, wherein each medial portion extends in an approximately perpendicular manner from its associated first and second mating portions.

6. The connector of claim 1, wherein the first and second contacts are disposed in an interleaved relationship such that the first and second medial portions are approximately parallel to each other.

7. A connector comprising:
   a first contact having a first mating portion, a second mating portion, and a first medial portion, the first medial portion being larger than the first and second mating portions, and extending in an approximately perpendicular manner from the first and second mating portions; and
   a second contact having a first mating portion, a second mating portion, and a second medial portion, the second medial portion is larger than the first and second mating portions, and extending in an approximately perpendicular manner from the first and second mating portions, wherein the first and second contacts are disposed in an interleaved relationship such that the first and second medial portions are approximately parallel to each other to reduce the mutual inductance in the first and second contacts, and each first and second mating portion of the first and second contacts are disposed to connect a first circuit board to a second circuit board.

8. The connector of claim 7, wherein the first contact and the second contact are disposed such that current flows in different directions in the first and second contacts, and in parallel in the first and second contacts, to reduce the mutual inductance in the first and second contacts.

9. The connector of claim 7, wherein the first and second contacts are sized to increase capacitance, thereby reducing the mutual inductance in the first and second contacts.

* * * * *